United States Patent
Tadatomo et al.

(10) Patent No.: US 6,734,515 B1
(45) Date of Patent: May 11, 2004

(54) SEMICONDUCTOR LIGHT RECEIVING ELEMENT

(75) Inventors: Kazuyuki Tadatomo, Itami (JP); Hiroaki Okagawa, Itami (JP); Youichiro Ohuchi, Itami (JP); Masahiro Koto, Itami (JP); Kazumasa Hiramatsu, Yokkaichi (JP); Yutaka Hamamura, Yokohama (JP); Sumito Shimizu, Yokohama (JP)

(73) Assignees: Mitsubishi Cable Industries, Ltd., Amagasaki (JP); Nikon Corporation, Tokyo (JP)

( * ) Notice: Subject to any disclaimer, the term of this patent is extended or adjusted under 35 U.S.C. 154(b) by 0 days.

(21) Appl. No.: 09/787,502

(22) PCT Filed: Sep. 13, 1999

(86) PCT No.: PCT/JP99/04993

§ 371 (c)(1), (2), (4) Date: Mar. 23, 2001

(87) PCT Pub. No.: WO00/17941

PCT Pub. Date: Mar. 30, 2000

(30) Foreign Application Priority Data

Sep. 18, 1998 (JP) ............................................. 10-265506
Sep. 18, 1998 (JP) ............................................. 10-265516

(51) Int. Cl.$^7$ ............................................... H01L 27/14
(52) U.S. Cl. ..................... 257/431; 257/432; 257/435; 257/436; 257/437; 257/449; 257/454; 257/471; 257/478; 257/604; 257/606; 257/608; 257/609; 257/742; 257/744; 257/745; 257/747; 257/749; 257/184; 257/189; 257/190; 257/200
(58) Field of Search ................................. 257/431, 432, 257/435, 436, 437, 449, 454, 745, 747, 744, 742, 471, 478, 749; 438/604, 606, 608, 609

(56) References Cited

U.S. PATENT DOCUMENTS

| | | | | |
|---|---|---|---|---|
| 4,028,720 A | * | 6/1977 | Pankove | 357/30 |
| 4,153,905 A | * | 5/1979 | Charmakadze et al. | 357/16 |
| 4,614,961 A | * | 9/1986 | Khan et al. | 357/30 |

(List continued on next page.)

FOREIGN PATENT DOCUMENTS

JP      11-195810    *   7/1999 ................... 257/43

OTHER PUBLICATIONS

Lim et al., "8×8 GaN Schottky Barrier Photodiode Array for Visible–Blind Imaging," *Electronic Letters*, 33 (7), 633–634 (Mar. 27, 1997).

*Primary Examiner*—T. Thomas
*Assistant Examiner*—Edgardo Ortiz
(74) *Attorney, Agent, or Firm*—Leydig, Voit & Mayer, Ltd.

(57) ABSTRACT

A semiconductor light receiving element having a light receiving layer (1) formed from a GaN group semiconductor, and an electrode (2) formed on one surface of the light receiving layer as a light receiving surface (1a) in such a way that the light (L) can enter the light receiving layer is provided. When the light receiving element is of a Schottky barrier type, the aforementioned electrode (2) contains at least a Schottky electrode, which is formed in such a way that, on the light receiving surface (1a), the total length of the boundary lines between areas covered with the Schottky electrode and exposed areas is longer than the length of the outer periphery of the light receiving surface (1a). In addition, when the light receiving element is of a photoconductive type, the aforementioned light receiving layer (1) is a first conductivity type i layer, and the aforementioned electrode (2) is an ohmic electrode of one polarity, and an ohmic electrode of the other polarity is formed directly or via a first conductivity type and low resistance GaN group semiconductor layer on the other surface of the light receiving layer (1).

6 Claims, 8 Drawing Sheets

U.S. PATENT DOCUMENTS

| | | | | |
|---|---|---|---|---|
| 5,010,381 A | * | 4/1991 | Shiba | 357/30 |
| 5,051,372 A | * | 9/1991 | Sasaki | 437/5 |
| 5,181,968 A | * | 1/1993 | Nath et al. | 136/256 |
| 5,210,051 A | | 5/1993 | Carter, Jr. | |
| 5,229,625 A | * | 7/1993 | Suzuki et al. | 257/77 |
| 5,239,188 A | * | 8/1993 | Takeuchi et al. | 257/76 |
| 5,247,533 A | * | 9/1993 | Okazaki et al. | 372/45 |
| 5,408,120 A | * | 4/1995 | Manabe et al. | 257/431 |
| 5,444,274 A | * | 8/1995 | Sasaki | 257/184 |
| 5,448,099 A | * | 9/1995 | Yano | 257/452 |
| 5,451,769 A | | 9/1995 | Mc Adoo et al. | |
| 5,461,246 A | * | 10/1995 | Chou | 257/449 |
| 5,629,533 A | * | 5/1997 | Ackley et al. | 257/80 |
| 5,710,439 A | * | 1/1998 | Ohkubo | 257/85 |
| 5,767,581 A | | 6/1998 | Nakamura et al. | |
| 5,777,390 A | * | 7/1998 | Berger et al. | 257/749 |
| 5,877,558 A | * | 3/1999 | Nakamura et al. | 257/749 |
| RE36,747 E | * | 6/2000 | Manabe et al. | 257/431 |
| 6,093,965 A | * | 7/2000 | Nakamura et al. | 257/749 |
| 6,121,127 A | * | 9/2000 | Shibata et al. | 438/604 |
| 6,204,512 B1 | * | 3/2001 | Nakamura et al. | 257/13 |
| 6,239,490 B1 | * | 5/2001 | Yamada et al. | 227/745 |

\* cited by examiner

SEMICONDUCTOR LIGHT RECEIVING ELEMENT

TECHNICAL FIELD

The present invention relates to a light receiving element using a GaN group semiconductor material.

BACKGROUND ART

To cope with the increasing density of integrated circuits, a stepper (step-and-repeat photolithographic system with demagnification) for forming a fine circuit pattern therefor is required to be capable of drawing more finely at higher resolution. Therefore, the laser beam used for exposure has been changed to that having a shorter wavelength range, from blue light to ultraviolet light, and changing the light having a wavelength of 248 nm (KrF excimer laser device) currently in use to the light having a wavelength of 193 nm (ArF excimer laser device) has been contemplated.

During the exposure step by the above-mentioned stepper, a part of the laser beam is received by a light receiving element and changes in the output and the like are monitored. As the light receiving element, a photodiode (PD) is useful. PD includes those made from Si group semiconductor materials. When the laser beam has a powerful energy, like the above-mentioned light at 248 nm, an Si group PD shows dramatic degradation, thus necessitating frequent replacement for a new one.

PD includes those based on many light receiving principles, one being a Schottky barrier type PD. With regard to the Schottky barrier type PD, wherein ultraviolet light is the receiving target, the invention disclosed in JP-A-61-91977 can be mentioned. This PD has a constitution wherein an AlGaN layer is grown on a sapphire substrate via an AlN buffer layer, and on this AlGaN layer are formed a Schottky electrode (electrode connected to form a Schottky barrier) and an ohmic electrode.

The PD of the above-mentioned publication has a structure wherein, as shown in FIG. 4(b), a light L3 (light receiving target) that enters from the substrate side reaches an area 210b right under a Schottky electrode 220 (a part of depletion layer spreading on the semiconductor side), where it is received. An ohmic electrode 230 is also formed on the upper surface 210a of a semiconductor layer 210. It is evident from the structure, wherein the Schottky electrode occupies a large area of the light receiving surface and the light can enter only from the substrate side, that this PD allows light to enter from the substrate side. Also, this publication clearly states, "When a photon enters a depletion region under the Schottky barrier through a transparent $Al_2O_3$ substrate, a pair of electron-holes is produced."

However, the PD of the above-mentioned publication has the following problems.

① Due to the constitution wherein the light to be received is passed through a thick AlGaN layer from a sapphire substrate, and led to the back of the Schottky electrode where it is received, the light is absorbed by the AlGaN layer and the sensitivity becomes low. In particular, a shorter wavelength of the ultraviolet light to be received is associated with a greater energy of the light, and as it separates from the band gap of AlGaN, an absorption coefficient of the light in the AlGaN layer suddenly becomes greater, and the light may not be able to reach a depletion layer region, which is formed by a Schottky junction, or a vicinity thereof at all.

② For the above-mentioned reason ①, the wavelength range of a detectable light is limited to a narrow range near the band gap of AlGaN. That is, a sensible wavelength range is narrow.

PD also includes those of a photoconductive type. A photoconductive type PD is a light receiving element wherein a current is taken out by utilizing a phenomenon (photoconductive effect) that the conductivity of the crystals changes due to the carrier generated in a light receiving layer (generally, a semiconductor crystal layer made to be a high-resistance layer) by light excitation, based on which the receipt of the light is detected.

A conventional photoconductive element, as shown in FIG. 8, has a constitution wherein both positive and negative ohmic electrodes 120, 130 are disposed facing each other on the surface of the light receiving layer 110 as a light receiving surface. The light L4 is capable of exciting a semiconductor crystal layer 110 and generates a carrier. Due to the generation of the carrier, the conductivity between the electrodes varies. By such constitution wherein the voltage is applied between the both electrodes 120 and 130, the entry of light can be detected as a change in the current.

According to the above-mentioned structure of a photoconductive element, the generated carrier moves between the electrodes along the light receiving surface. The present inventors have found it problematic.

That is, the light receiving surface is literally a surface of or an interface between materials forming the light receiving layer, and is constantly exposed to a light having a severe energy. As a result, the light receiving surface and the surface layer thereof are subject to various quality problems, such as contamination from the surrounding environment during practical use, degradation of the semiconductor surface due to the incident light and the like, which are caused by the light receiving surface being an interface. With the structure of a conventional element wherein the carrier moves on the surface layer along the light receiving surface, therefore, the recombination velocity of the carrier dramatically changes, lowering the reproducibility of the detection results, and impairing the reliability of a photodetecting element.

It is therefore an object of the present invention to provide a light receiving element having superior resistance also to a light having a wavelength in the ultraviolet range.

Another object of the present invention is to provide a Schottky barrier type light receiving element having, besides the superior resistance also to a light having a wavelength in the ultraviolet range, much superior sensitivity as compared to conventional ones, based on a new constitution.

A yet another object of the present invention is to provide a photoconductive type light receiving element having a new structure capable of decreasing the contamination of and a degrading influence on a light receiving surface, besides the superior resistance also to a light having a wavelength in the ultraviolet range.

DISCLOSURE OF THE INVENTION

The light receiving element of the present invention is characterized by the following.

(1) A semiconductor light receiving element comprising a light receiving layer comprising a GaN group semiconductor and an electrode formed on one surface of the light receiving layer as a light receiving surface, in such a way that the light can enter the light receiving layer.

(2) The light receiving element of the above-mentioned (1), wherein the light receiving element is a Schottky barrier type light receiving element, the above-mentioned light receiving layer is a first conductivity type layer, the above-mentioned electrode formed on the above-mentioned light receiving surface comprises at least a Schottky electrode, and a total of boundary lines between areas of the light receiving surface covered with the Schottky electrode and exposed areas is longer than the length of the outer periphery of the light receiving surface.

(3) The light receiving element of the above-mentioned (2), wherein the above-mentioned Schottky electrode has a wiring pattern formed by strip conductors in combination.

(4) The light receiving element of the above-mentioned (2), wherein the above-mentioned strip conductors have a width of 0.1 μm–2000 μm.

(5) The light receiving element of the above-mentioned (2), wherein the above-mentioned wiring pattern is a comblike pattern.

(6) The light receiving element of the above-mentioned (2), wherein the above-mentioned light receiving layer is an uppermost layer of a laminate comprising one or more layers comprising a first conductivity type GaN group semiconductor formed on a crystal substrate, which element comprising an ohmic electrode formed on a layer other than the light receiving layer.

(7) The light receiving element of the above-mentioned (6), wherein the crystal substrate is made from a conductive material and the ohmic electrode is formed on the crystal substrate.

(8) The light receiving element of the above-mentioned (1), wherein the light receiving element is a photoconductive type light receiving element, the above-mentioned light receiving layer is a first conductivity type i layer, and the above-mentioned electrode formed on the above-mentioned light receiving surface is an ohmic electrode of one polarity, which element comprising an ohmic electrode of the other polarity formed on the other surface of the light receiving layer directly or via a first conductivity type and low resistance GaN group semiconductor layer.

(9) The light receiving element of the above-mentioned (8), wherein the ohmic electrode of one polarity is formed as a transparent electrode to permit an entry of light.

(10) The light receiving element of the above-mentioned (8), wherein the ohmic electrode of one polarity is an opaque electrode and the light receiving surface has an area covered with the electrode and an incident area not covered with the electrode to permit entry of the light.

(11) The light receiving element of the above-mentioned (8), wherein the ohmic electrode of the other polarity mentioned above is formed via a first conductivity type and low resistance GaN group semiconductor layer, the aforementioned low resistance GaN group semiconductor layer and the light receiving layer are successively formed on a crystal substrate, an upper surface of the low resistance GaN group semiconductor layer is partially exposed, and the ohmic electrode of the other polarity is formed on this exposed surface.

(12) The light receiving element of the above-mentioned (11), wherein the above-mentioned crystal substrate is a sapphire crystal substrate, the above-mentioned low resistance GaN group semiconductor layer is an n+—GaN group semiconductor layer, the above-mentioned light receiving layer is an n−—GaN group semiconductor layer, and the ohmic electrode of one polarity formed on the above-mentioned light receiving surface is a comblike electrode.

BRIEF DESCRIPTION OF THE DRAWING

FIG. 1 shows one embodiment of the light receiving element (particularly Schottky barrier type) of the present invention, wherein

DETAILED DESCRIPTION OF THE INVENTION

Figure 1A:
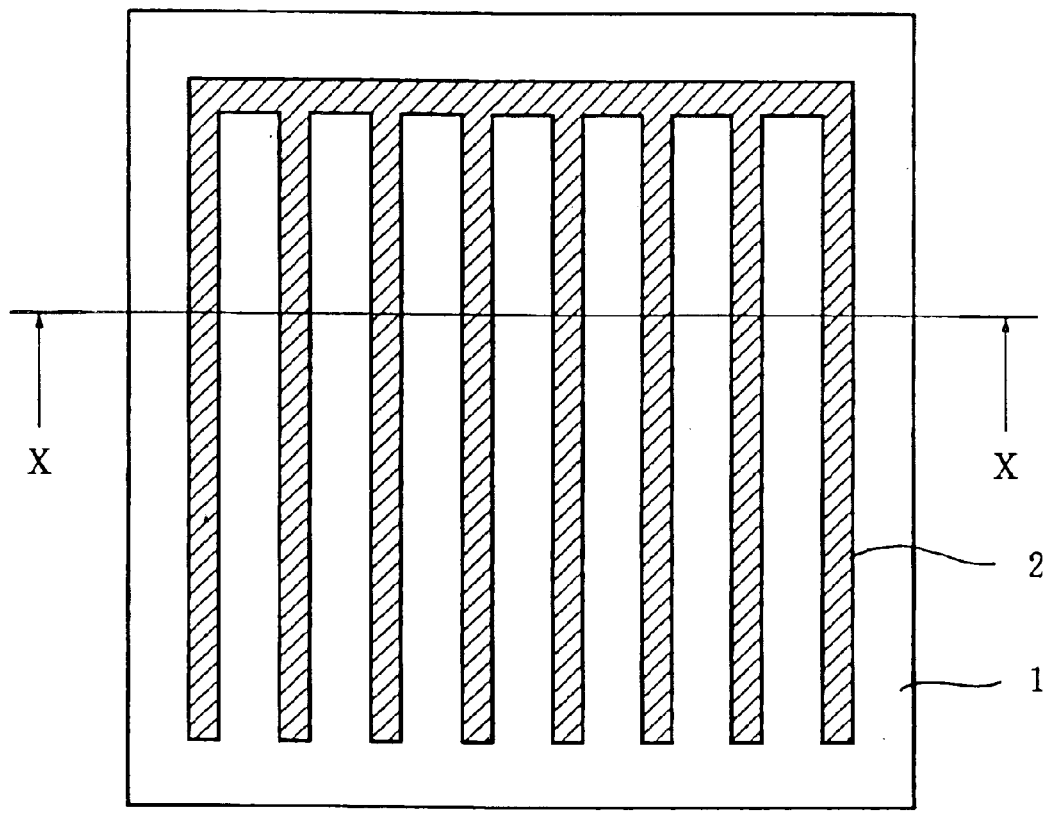
FIG. 1(a) shows the light receiving surface and FIG. 1(b) is an end view partially showing the section of FIG. 1(a) along the line X—X. Hatching is applied to identify electrodes (hereinafter the same).
Figure 1B:
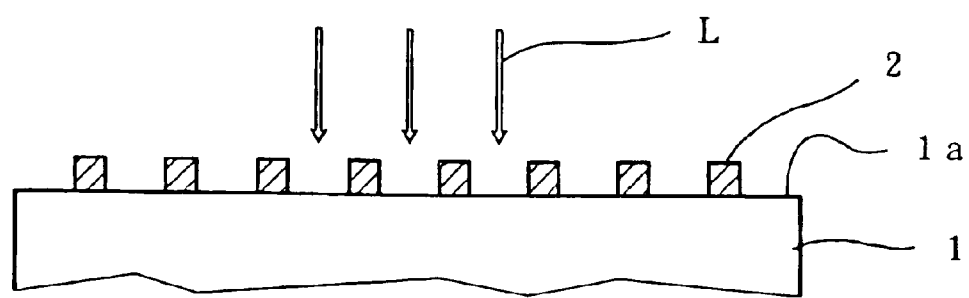

The light receiving element of the present invention comprises, for example, as shown in FIG. 1, a light receiving layer 1 consisting of a GaN group semiconductor, and an electrode 2 formed on one surface of the light receiving layer as a light receiving surface 1a. The electrode 2 is formed in such a way that light L to be detected can enter the light receiving layer 1. Because a GaN group semiconductor crystal is used as the material of the light receiving layer, a superior light receiving element improved in ultraviolet resistance, as compared to a conventional PD and the like made from an Si group semiconductor material, can be obtained.

Examples of the specific embodiment of the light receiving element of the present invention include a Schottky barrier type light receiving element (PD) of the above-mentioned (2) and a photoconductive type light receiving element (PD) of the above-mentioned (8).

The GaN group semiconductor as used in the present invention is a compound semiconductor defined by the formula $In_XGa_YAl_ZN$ ($0 \leq X \leq 1$, $0 \leq Y \leq 1$, $0 \leq Z \leq 1$, X+Y+Z=1).

The optimal components of the GaN group semiconductor used for the light receiving layer are determined by the end value of the longer wavelength within the wavelength range of the light to be the detected. For example, ① when a light in the blue region (near 480 nm) or of a wavelength range shorter than that is the target, InGaN is used, ② when an ultraviolet light in a short wavelength range of not more than 400 nm is the target, InGaN with less In component is used, and ③ when an ultraviolet light at not more than 365 nm is the sole target, GaN and AlGaN are used.

The light to be received by the light receiving element of the present invention is determined according to the band gap of the GaN group semiconductor used for the light receiving layer. It is a light having a shorter wavelength than red light (near wavelength 656 nm). When a light having a short wavelength from blue to ultraviolet light, X rays is the target, the utility of the present invention becomes noticeable. In particular, ultraviolet light, such as the light having a wavelength of 248 nm, which is emitted by a KrF excimer laser device, the light having a wavelength of 193 nm, which is emitted by an ArF excimer laser device and the like, have an intense energy, which causes many problems for conventional elements. By the use of a GaN group semiconductor to receive such ultraviolet light, a superior light receiving element having an improved resistance to ultraviolet light can be obtained.

First, a Schottky barrier type light receiving element of the embodiment of the above-mentioned (2) is explained. This light receiving element has, as shown in FIG. 1, a layer of a first conductivity type GaN group semiconductor as a light receiving layer 1. L is the light to be detected. With one side surface of the light receiving layer 1 as a light receiving surface 1a, at least a Schottky electrode 2 is formed on the light receiving surface 1a. The Schottky electrode is formed in such a way that, in the above state, the total length of the boundary lines between the covered areas and the exposed areas (total length of a visible outline of Schottky electrode in the embodiment of FIG. 1(a)) is longer than the outer periphery of the light receiving surface.

The light receiving surface in the embodiment of the above-mentioned (2) refers to, of the both surfaces of the light receiving layer, the entire surface where the light is received. The Schottky electrode is formed to partially cover this light receiving surface. In the following, the area of the light receiving surface, which is covered with the Schottky electrode, is to be referred to as an "electrode area" and the exposed area is to be referred to as an "exposure area" for explanation.

The embodiment of the above-mentioned (2) is a Schottky barrier type PD. Therefore, not only the Schottky electrode but the other corresponding electrode is formed to function as a light receiving element. This other electrode is preferably an ohmic electrode. The ohmic electrode is to be explained later. The mechanism itself of the photodetection using the Schottky barrier is the same as for a conventional Schottky barrier type PD. Briefly explaining an n-type light receiving layer, a backward bias voltage is applied between the both electrodes to facilitate the flow of electron from the Schottky electrode to the light receiving layer, and the flow of the electron generated in the light receiving layer by the light excitation is detected as a current.

Figure 4A:
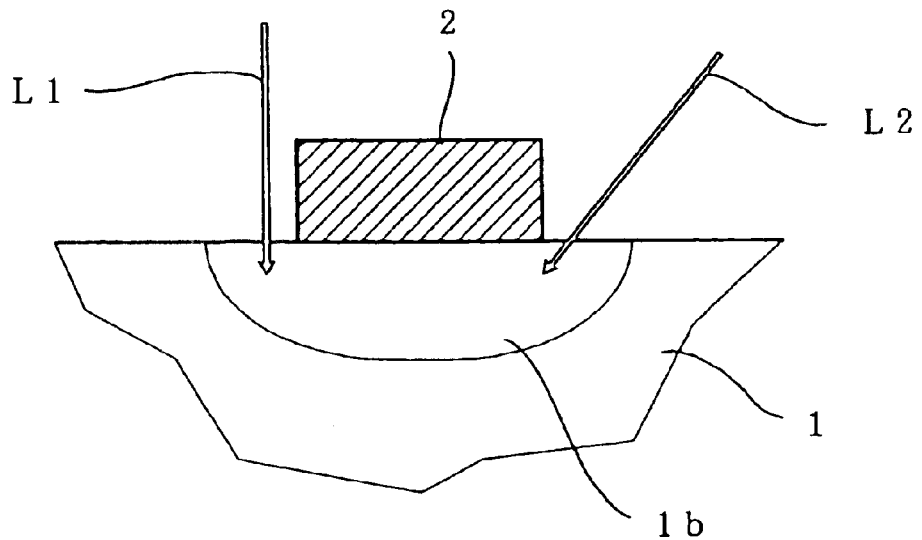
FIG. 4 shows comparison of the present invention and a conventional embodiment with regard to the relationship between the depletion layer of a Schottky barrier and incident light.

The important characteristic of the present invention is taking note of the fact that a depletion layer 1b is larger than Schottky electrode 2 and covers a small area around the electrode, extending from under the electrode, as shown in FIG. 4(a), and utilization of the area. The light L1 can enter this small area (hereinafter an extending part of the depletion layer) of the depletion layer extending from around the electrode also from the upper surface side of the electrode. Even if completely under the Schottky electrode, light can enter the vicinity of the outer periphery of the electrode from an oblique angle, like light L2. In addition, the light that entered the semiconductor causes an interaction with the depletion layer under the electrode due to the diffraction effect.

In the present invention, this extending part of the depletion layer and the area of the depletion layer near the part directly below the periphery of the electrode are secured as widely as possible, to positively utilize the area for detection of the received light. For this end, it is important that the boundary line between the electrode area and the exposure area be longer. According to the present invention, the Schottky electrode is made to have a complicated shape, so that the length of the boundary line can be longer than the total length of the outer periphery of the light receiving surface, thereby to detect the light irradiated from the upper surface side of the electrode.

Figure 4B:
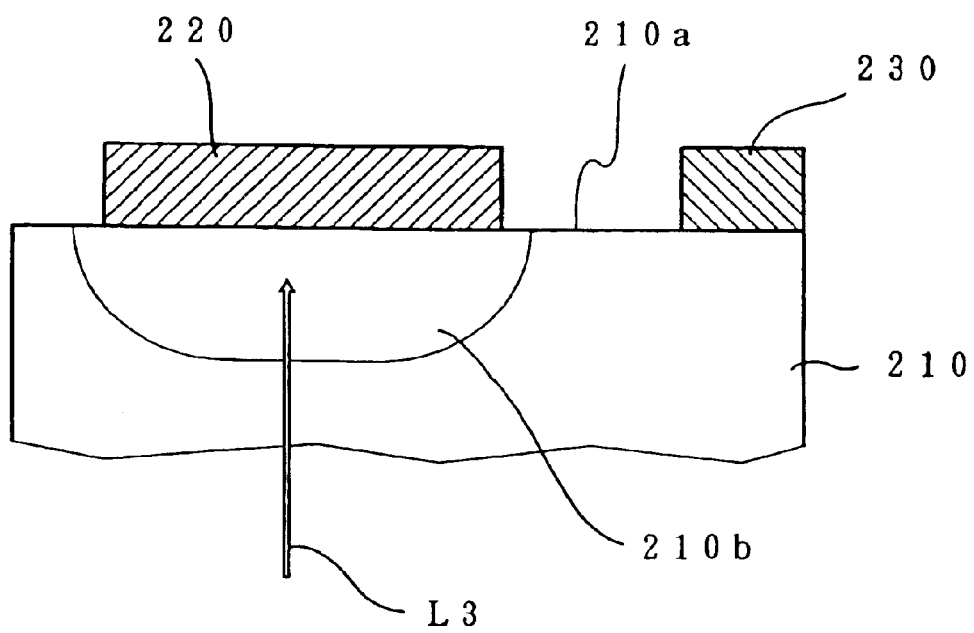

In contrast, in a conventional Schottky barrier type light receiving element, as shown in the above-mentioned publication and FIG. 4(b), the light to be received L3 enters from the substrate side and is received at the central part of the depletion layer 210b formed on the back of the Schottky electrode 220. In other words, it is important for conventional ones to make the area of the Schottky electrode greater. A conventional Schottky electrode also has a depletion layer greater than the electrode, which extends slightly around the electrode. To make the electrode area more efficiently and larger, the length of the boundary line between the electrode area and the exposure area becomes shorter, wherein its longest length equals the length of the outer periphery of the light receiving surface.

The width of the depletion layer necessary for receiving light becomes greater with greater gaps of the Schottky barrier and the amount of the layer extending from the electrode becomes greater around the electrode. Therefore, the material is preferably so selected that the gap of the Schottky barrier becomes greater. From such point of view, the carrier concentration of the light receiving layer is preferably decreased to the level of i-layer, to make the gap of Schottky barrier greater.

In the embodiment of the above-mentioned (2), the conductive type of the GaN group semiconductor used for the light receiving layer may be of a first conductivity type (i.e., p-type or n-type), but it is preferably of an n-type in view of the control of the impurity concentration and feasibility of electrode forming.

The embodiment of the above-mentioned (2) is explained in the following by referring to the embodiment comprising an n-type light receiving layer.

A Schottky electrode refers to an electrode having a potential barrier called a Schottky barrier due to the junction between a metal and a semiconductor. This electrode is formed from a metal characterized by an energy band diagram of the contact part between the metal and the semiconductor, and described in, for example, "Semiconductor Device", S. M. Sze (translated by Yasuo Nannichi et al.), Sangyo Tosho (first edition, 3rd printing), page 164. Since the height $q\phi$ of the Schottky barrier is the difference between the work function $\phi m$ of the metal and the electron affinity $\chi$ of the semiconductor, i.e., $q\phi = q(\phi m - \chi)$, and a material having a relatively large $\phi m$ is desirable.

The material of the Schottky electrode is exemplified by Au, Pt, Ti, W, Ni, Pd and the like. These materials may be used in combination.

The shape of the electrode when the Schottky electrode is seen from the upper surface side needs to be, as stated in the foregoing explanation of the action, long enough to enable detection of the receipt of the light even solely with the light from the upper surface side of the electrode. This is explained in the following using a simple model.

Figure 2:
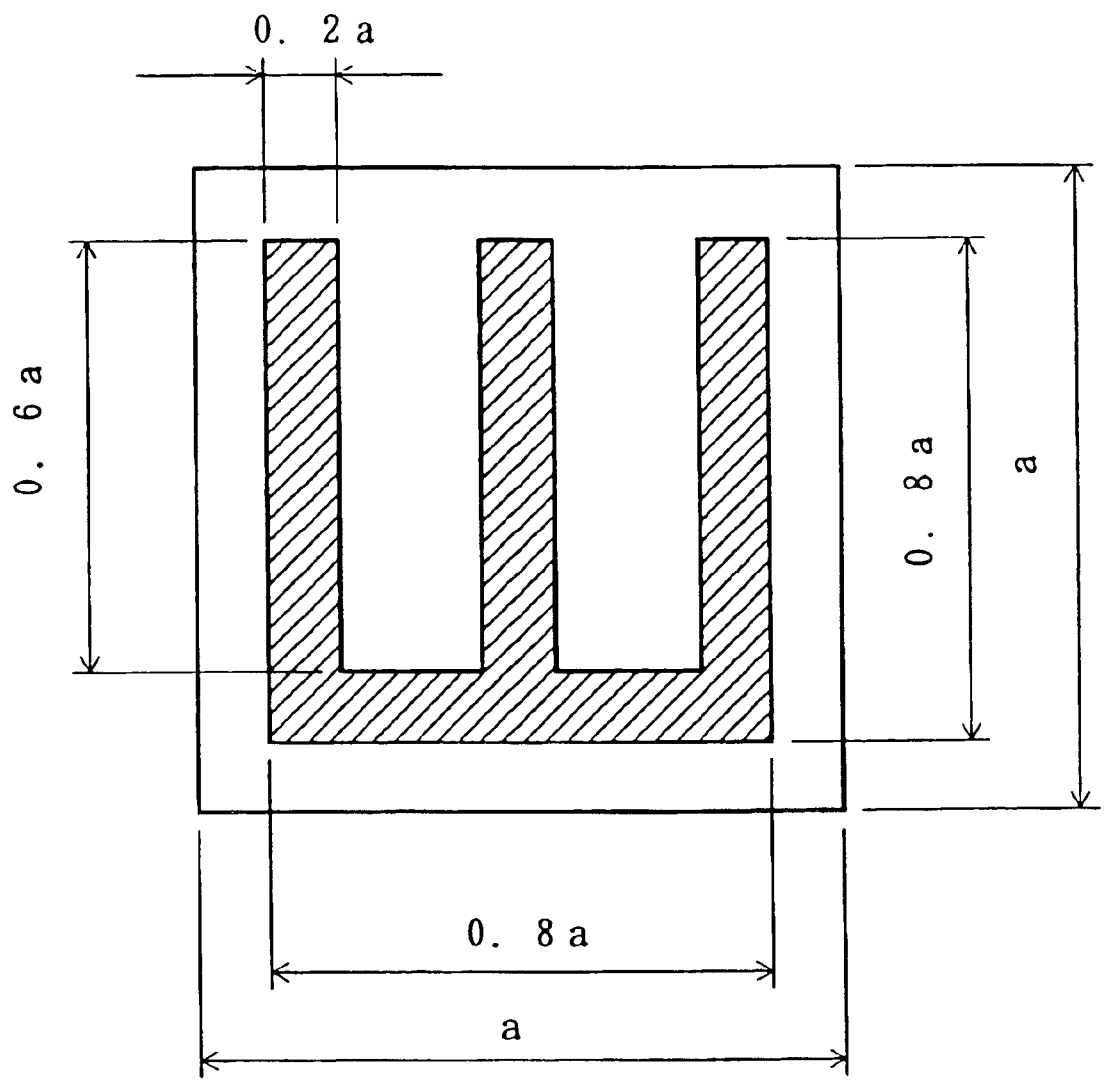
FIG. 2 shows the relationship between a light receiving surface and the shape of a Schottky electrode in the light receiving element of the present invention.

FIG. 2 shows a shape of a Schottky electrode when the light receiving surface is a square of one side being a. The shape of the electrode is a comblike wiring pattern including three teeth of the comb. When the longitudinal and transverse sizes of the comb as a whole is 0.8a×0.8a and the width of the strip conductors constituting the comb is 0.2a, the total length of the boundary lines between the electrode areas and the exposure areas is 5.6a, which is 1.4 times the length of the outer periphery of the light receiving surface.

When the number of comb teeth is 8, as shown in FIG. 1, and the width of the strip conductors (electrode material) is 0.1a, the total length of the boundary lines is about 13a, which is about 3 times the length of the outer periphery of the light receiving surface.

When the shape of the Schottky electrode has a comblike wiring pattern, as shown in FIG. 1 and FIG. 2, the part corresponding to the comb teeth shows a stripe pattern with strip conductors arranged in parallel. Though subject to change depending on the size of the element and the arrange environment (intensity of light and the like), the width of the strip conductor corresponding to the comb teeth is preferably 0.1 μm–2000 μm, and the width of the space between conductors is preferably 0.1 μm–1000 μm.

When the Schottky electrode has a striped pattern with strip conductors arranged in parallel, as in the above-mentioned comblike electrode, a greater space between conductors bring about greater light receiving sensitivity.

When, for example, GaN is used as the material of the light receiving layer, the total of the width of the depletion layer extending from the adjacent strip conductors into the space between them is approximately 0.1 μm—several tens of μm, and the width of the strip conductor is preferably determined in consideration of this value. When the width of the strip conductor is too small, the electrode has too great a resistance. The ratio of the width of a strip conductor and the width of the space between conductors is preferably about width of strip conductor/width of space between conductors ≦ 1.

When the width of the space between conductors, from the above-mentioned range, is the same as the thickness of depletion layer—ca. twice the thickness of depletion layer, the extending part of the depletion layer covers, and overlaps in a desired manner, the space between conductors. In this way, the depletion layer reaches the conductive layer, which is an underlying layer of the light receiving layer, and the entire light receiving surface is filled with the depletion layer, which is conducive to superior light receiving efficiency.

When a backward bias voltage is applied, the thickness and the extending amount of the depletion layer increase. When a backward bias voltage is applied for the receipt of light, therefore, the width of the space between conductors is preferably determined relative to the thickness of the depletion layer widened because of the application of the backward bias voltage.

In addition to the above-mentioned comblike shape, the shape of the Schottky electrode may be of a wiring pattern, which is an arbitrary combination of strip conductors. For example, a pattern formed by strip conductors meandering like a square wave, a grid-like cross pattern and the like are mentioned. The width of strip of the strip conductors is the same as in the above-mentioned comblike shape, which is preferably 0.1 μm–2000 μm. It may be a pattern including an opening having an optional shape as an exposure area, besides the above-mentioned pattern. The greater the number of openings, the greater the total length of the boundary lines between electrode areas and exposure areas.

The light receiving element of the above-mentioned (2) according to the present invention is preferably constituted as a laminate comprising a GaN group semiconductor layer which is crystal grown on a crystal substrate, as in the case of a typical semiconductor light emitting element. In this case, the light receiving layer is located as the uppermost layer of the laminate. The structure of this laminate and the positional relationship between the Schottky electrode and ohmic electrode is exemplarily shown in FIG. 3.

Figure 3A:
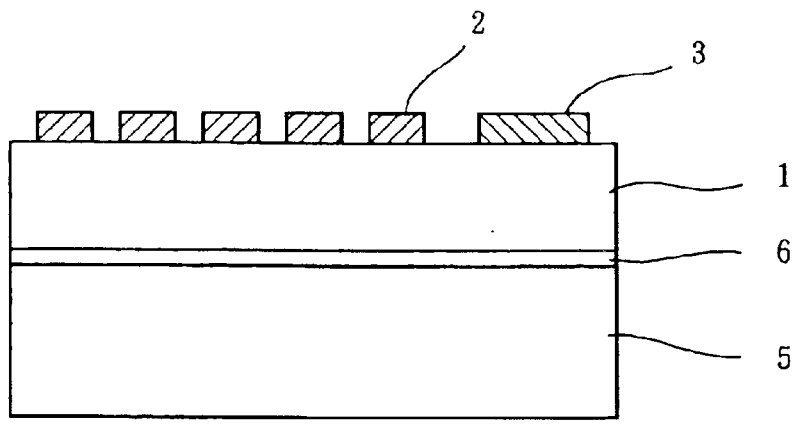
FIG. 3 shows an example of the structure of the light receiving element (particularly Schottky barrier type) of the present invention, which is an end view of the light receiving element of FIG. 1(a) cut along the line similar to X—X.

In the embodiment of FIG. 3(a), a light receiving layer 1 comprising an n-type GaN group semiconductor which is crystal grown on a crystal substrate 5 via a buffer layer 6, wherein an ohmic electrode and the Schottky electrode are formed on the same light receiving surface.

Figure 3B:
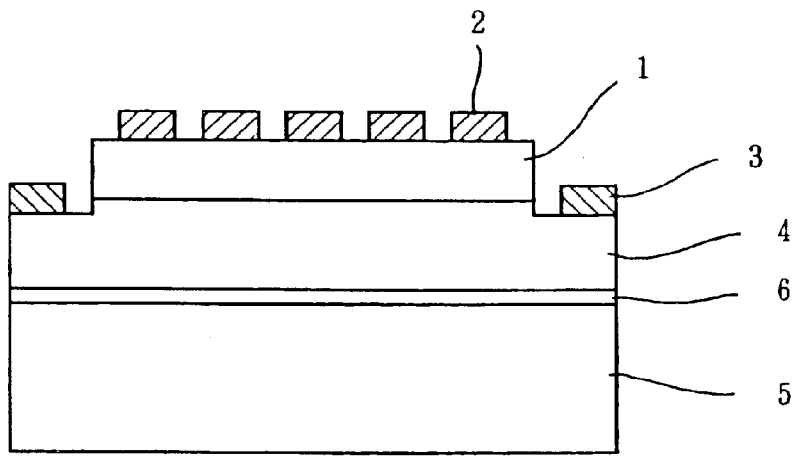

In the embodiment of FIG. 3(b), an n-type GaN group semiconductor layer 4 to form an ohmic electrode is formed separately from the light receiving layer. Such embodiment is preferable, because a carrier concentration suitable for each of the Schottky electrode and ohmic electrode can be easily set. While the ohmic electrode is formed on the upper surface of a layer 4, a planar arrangement pattern comprise the ohmic electrode surrounding the complete circumference of the light receiving layer.

Figure 3C:
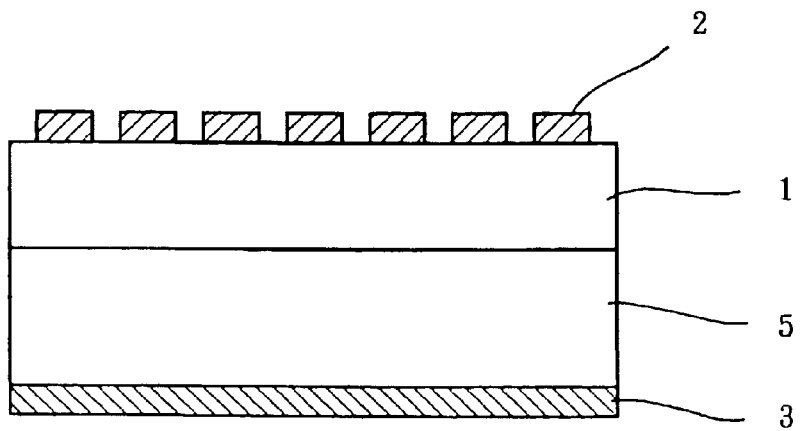

In the embodiment of FIG. 3(c), the crystal substrate is made from a conductive material and the ohmic electrode is formed on the crystal substrate.

An ohmic electrode refers to one wherein metal-semiconductor contact does not show rectification properties (irrespective of the direction of the voltage to be applied), and contact resistance can be almost ignored (see, for example, "Semiconductor Device", S. M. Sze (translated by Yasuo Nannichi et al.), Sangyo Tosho (first edition, 3rd printing, pages 163, 174). The contact between a semiconductor doped at a high concentration and a metal markedly narrows the width of the depletion layer to be formed, which in turn facilitates the flow of a tunnel current, easily making the electrode ohmic.

The material of the ohmic electrode (upper side material/lower side material in the case of a laminate) is exemplified by Al/Ti, Au/Ti, Ti, Al and the like. These materials may be used in combination.

In addition, since a voltage is applied to make backward bias applied to the Schottky electrode side, the presence of Schottky barrier on the ohmic electrode side does not pose a serious problem. This means that, even if the both electrodes are formed with a Schottky electrode, when a backward bias voltage is applied to the electrode on the light receiving surface, the forward bias is applied to the other electrode, as a result of which it functions like an ohmic electrode.

The crystal substrate may be any as long as a GaN group semiconductor can be crystal grown, and is exemplified by sapphire, quartz, SiC etc., and a GaN group semiconductor crystal.

When a crystal substrate is an insulator, a sapphire substrate (C face, A face), particularly sapphire substrate (C face), is preferable. When a crystal substrate requires conductivity, a 6H—SiC substrate and a GaN group semiconductor crystal are preferable. As shown in FIG. 3(a), moreover, a laminate comprising a buffer layer of ZnO, MgO, AlN and the like, which is formed on the surface of a sapphire crystal substrate and the like, to alleviate the difference in the lattice constant with GaN group semiconductor crystal, and also the coefficient of thermal expansion, may be regarded a substrate, and a thin film of a GaN group semiconductor crystal may be further formed thereon.

Figure 5A:
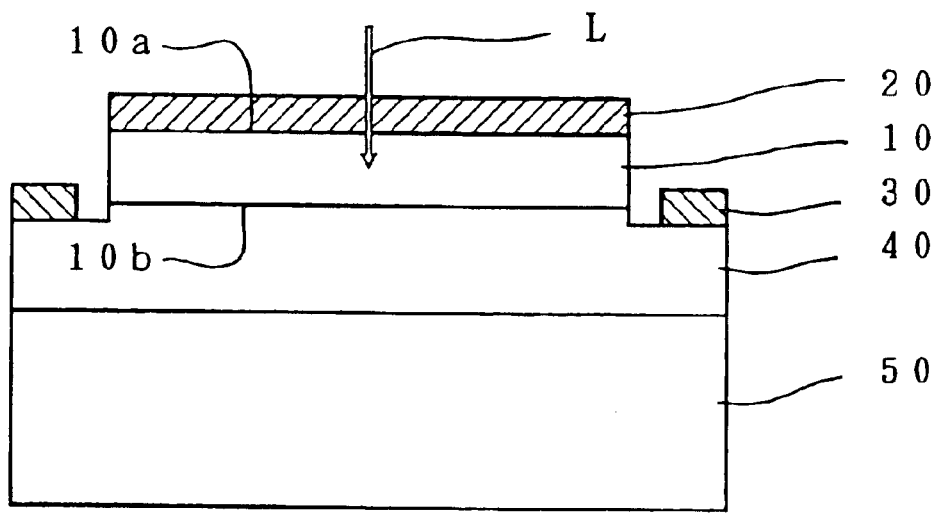
FIG. 5 is a sectional view of an exemplary structure of the light receiving element (particularly photoconductive type) of the present invention, wherein FIG. 5.(a) shows an embodiment of a transparent electrode
FIG. 5(b) shows an embodiment of an opaque electrode.
Figure 5B:
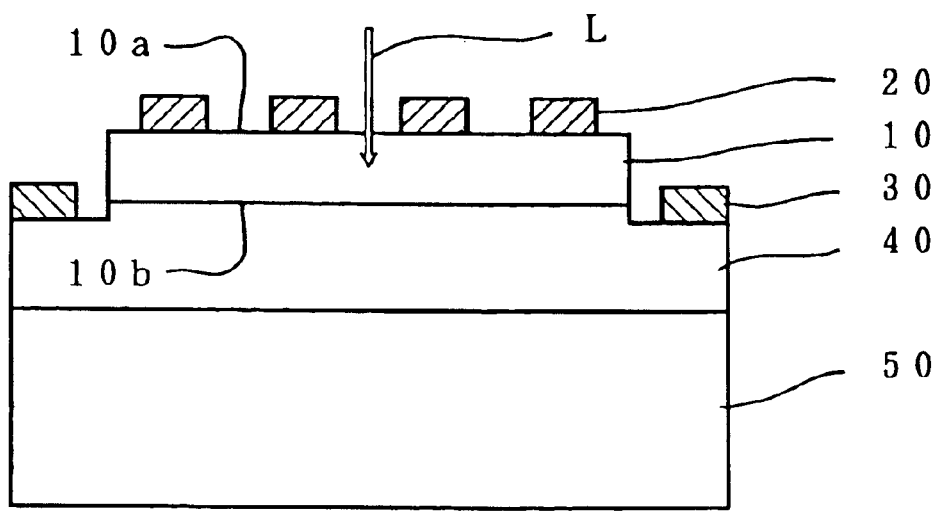

A photoconductive type light receiving element, which is an embodiment of the above-mentioned (8), is explained in the following. This light receiving element has a first conductivity type (n-type in this Figure) i layer made from a GaN group semiconductor, as a light receiving layer 10, as shown in FIGS. 5(a), 5(b). One surface of the light receiving layer 10 is a light receiving surface 10a that the light L enters. The light receiving surface 10a has an ohmic electrode 20 of one polarity. The ohmic electrode 20 is formed to permit entry of light L. The other surface 10b of the light receiving layer has an ohmic electrode 30 of the other polarity via the same conductive type and low resistance GaN group semiconductor layer 40 as the light receiving layer, thus constituting the photoconductive element. The ohmic electrode 30 of the other polarity may be directly formed on the other surface 10b of the light receiving layer. Hereinafter, a GaN group semiconductor layer 40 for forming an ohmic electrode of the other polarity is also simply referred to as a contact layer.

The i layer is a general name for a low concentration layer, referring either to an n-type low concentration layer (called ν layer and written as $n^-$) or a p-type low concentration layer (called π layer and written as $p^-$).

The photoconductive type light receiving element, which is an embodiment of the above-mentioned (8), is the same as the one explained as regards the conventional art for the basic mechanism of detecting the receipt of light, wherein a photoconductive effect is utilized to take out a current, based on which the receipt of light is detected.

The important characteristic of the light receiving element of the above-mentioned (8) is a constitution where an ohmic electrode of one polarity is formed on the light receiving surface of the light receiving layer, and an ohmic electrode of the other polarity is formed on the back of the light receiving surface directly or via other crystal layer (high concentration layer of the same conductive type as the light receiving layer). By this constitution, a carrier generated in the light receiving layer due to incident light moves not only on the surface along the light receiving surface, but in the thickness direction of the light receiving layer. In other words, since the area occupied by the surface layer becomes smaller and, conversely, the area occupied by the high quality depth increases, both relative to the carrier motion path, the recombination velocity of the carrier can be further stabilized.

The conductive type of the light receiving layer is a first conductivity type (i.e., either p-type or n-type). To increase an S/N ratio by lowering the dark current, it is preferably an n-type low concentration layer (ν layer) or an i layer. The light receiving layer (i layer) has a carrier concentration of not more than $1 \times 10^{17}$ cm$^{-3}$. The lower limit is, for example, about $1 \times 10^{13}$ cm$^{-3}$.

The thickness of the light receiving layer is not limited, but it is preferably not less than the thickness of the depletion layer, which is preferably about 0.1 μm–5 μm, because a carrier needs to be generated in the entirety of the layer by light absorption.

The material of the light receiving layer need only be a GaN group semiconductor, but InGaN is preferable for the light having a wavelength longer than 365 nm, GaN and AlGaN are preferable for the ultraviolet light having a wavelength shorter than 365 nm.

The both electrodes are ohmic so that the variation of resistance due to a photoconductive effect can be detected with high sensitivity.

The ohmic electrode to be formed on the light receiving surface should be formed in such a way that the light can enter the light receiving layer. Examples of such electrode include a transparent electrode as shown in FIG. 5(a). Even in the case of an opaque electrode, as shown in FIG. 5(b), an excess incident amount of light L is secured by forming an incident area not covered with the electrode on a light receiving surface 10a, based on which the incident area and an area covered with the electrode can be balanced.

As the ohmic electrode to be formed on the light receiving surface, when the light receiving layer is an n-type low concentration layer, a transparent electrode, such as Au (thickness 50 nm)/Ti (thickness 100 nm) and the like, can be used, and the opaque electrode is exemplified by Au (thickness 1 μm)/Ti (thickness 100 nm) and the like. In addition, when the light receiving layer is a p-type low concentration layer, the transparent electrode is exemplified by Au (thickness 50 nm)/Ni (thickness 100 nm) and the like, and the opaque electrode is exemplified by Au (thickness 500 nm)/Ni (thickness 100 nm), Al, Ti and the like. The thickness of the above-mentioned electrode, particularly that of an opaque electrode, is merely one example, to which the thickness is not limited.

In the case of a low carrier concentration, a practical problem of unfeasible ohmic contact exists. To solve this, a layer having a free electron (or hole) concentration of about $1 \times 10^{18}$ cm$^{-3}$ and a thickness of about 10 nm–50 nm is preferably inserted as a layer for ohmic contact (referred to as an ohmic contact layer), between the light receiving layer and electrode. For a conventional type, wherein a pair of electrodes is formed on a light receiving surface and a current flows along the light receiving surface, the ohmic contact layer needs to be separated by cutting between electrodes. In contrast, such layer can be left without cutting in the present invention.

The arrangement pattern of the ohmic electrode formed on a light receiving surface may include a part or the entirety of the light receiving surface, in the case of a transparent electrode. In the case of an opaque electrode, an area covered with the electrode and an incident area not covered with the electrode are formed. For example, a comblike, lattice or other electrode pattern can be formed.

The other ohmic electrode is formed on the back of the light receiving layer directly or via a contact layer, as mentioned above. To compensate for the thickness of the light receiving layer, the latter embodiment is preferable. Even in this case, a laminate is preferable wherein contact layer 40 and light receiving layer 10 are successively grown on the base crystal substrate 50, as shown in FIGS. 5(a), (b). A different GaN group semiconductor layer may be formed as necessary between the crystal substrate and contact layer. When the crystal substrate 50 is an insulator like a sapphire substrate, a preferable embodiment includes an upper side surface of the contact layer 40 exposed as shown in FIG. 5, and the other ohmic electrode formed on the exposed surface.

The contact layer is preferably of the same conductive type as the light receiving layer, and preferably has low resistance, i.e., a carrier concentration of not less than $1 \times 10^{17}$ cm$^{-3}$. The upper limit of the carrier concentration is, for example, about $1 \times 10^{19}$ cm$^{-3}$.

A contact layer preferably has a thickness of about 1.0 μm–5.0 μm to secure crystallinity of the light receiving layer.

While there are a number of combinations of the materials for light receiving layer and contact layer, examples thereof (light receiving layer material/contact layer material) include ($n^-$ —GaN/$n^+$ —GaN), ($n^-$ —AlGaN/$n^+$ —GaN), ($n^-$ —AlGaN/$n^+$ —AlGaN), ($n^-$ —InGaN/$n^+$ —GaN), ($n^-$ —GaN/$n^+$ —AlGaN) and the like.

Figure 6A:
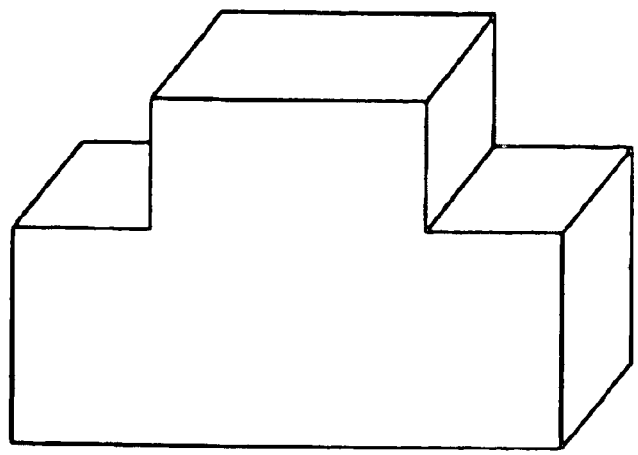
FIG. 6 is a perspective view showing the entire shape of the light receiving element (particularly photoconductive type) of the present invention.
Figure 6B:
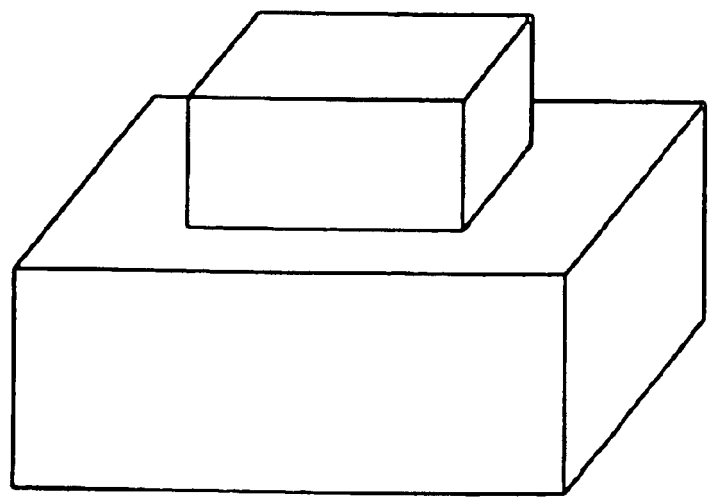

In the embodiments shown in FIG. 3(b) and FIG. 5, the shape of the element as a whole may be a combination of rectangle and column, forming a step-like shape in only one direction, as shown in FIG. 6(a), or a step-like shape in all directions, as shown in FIG. 6(b). The shape is appropriately determined in consideration of feasibility of production, preferable properties and the like. In the case shown in FIG. 6(b), the electrode 30 to be formed on the upper surface of the contact layer 40 may surround the outer periphery of the element or may be formed partially.

EXAMPLES

The present invention is explained in detail in the following by referring to Examples.

Example 1

In this Example, a Schottky barrier type PD of the above-mentioned (2) was prepared. The Schottky electrode to be formed on the light receiving surface had a comblike wiring pattern, and the Schottky electrode and an ohmic electrode were both formed on the light receiving surface.

As shown in FIG. 3(a), an n-type AlGaN layer (light receiving layer) 1 was grown on a sapphire substrate (C face) 5 via a GaN buffer layer 6. The AlGaN layer had a component ratio that made the band gap about 3.67 eV, a thickness of 3 μm, a light receiving surface having a 5 mm×5 mm square outer periphery, and a carrier concentration of $1\times10^{17}$ cm$^{-3}$.

The Schottky electrode having a comblike pattern was formed in a 5 mm×4840 μm square area in the square light receiving surface, and a square ohmic electrode was formed in the remaining area, the two facing each other.

The Schottky electrode was made from Au and had a thickness of 500 nm and a comblike pattern having 500 teeth. The total length of the boundary lines between the electrode areas and exposure areas was about 230 times the length of the outer periphery of the light receiving surface.

The ohmic electrode was formed on the light receiving surface in the order of Ti layer and Al layer.

Applying a 5V backward bias between both electrodes, a light having various wavelengths was applied from the direction perpendicular to the light receiving surface to examine the properties of the light receiving. As a result, the presence of sensitivity was acknowledged with regard to the ultraviolet light at not more than about 340 nm. With regard to the range of wavelength at not more than 340 nm, light absorption properties of AlGaN that pose problems in the conventional cases where the light enters from the substrate side, conversely contributed to the light receiving sensitivity in the present invention, making the properties flat. With regard to the range of wavelength longer than 340 nm, because the light was not absorbed and the temperature of the element did not rise very much, no sensitivity was found.

Example 2

In this Example, a different embodiment of the Schottky barrier type PD of the above-mentioned (2) was prepared. The Schottky electrode had a comblike wiring pattern, and an ohmic electrode was formed on the crystal substrate comprising an n-type semiconductor.

As shown in FIG. 3(c), an n-type InGaN layer (light receiving layer) 1 was grown on the n-type GaN crystal substrate 5. The InGaN layer had a component ratio that made the band gap about 2.93 eV, a thickness of 5 μm, a light receiving surface having a 1 mm×1 mm square outer periphery and a carrier concentration of $1\times10^{18}$ cm$^{-3}$.

The Schottky electrode was made from Au and had a thickness of 20 nm and a comblike pattern having 200 teeth. The total length of the boundary lines between the electrode areas and exposure areas was about 86 times the length of the outer periphery of the light receiving surface.

The ohmic electrode was formed on the back of the n-type GaN crystal substrate 5 in the order of Ti layer and Al layer.

Applying a 3V backward bias between both electrodes, the properties of the light receiving were examined as in Example 1. As a result, the presence of sensitivity was acknowledged with regard to the ultraviolet light at not more than about 425 nm. With regard to the wavelength range of not more than 425 nm, the properties were flat, as in Example 1. With regard to the range at a wavelength longer than 425 nm, no sensitivity was found.

Example 3

In this Example, a photoconductive type light receiving element of the above-mentioned (8), which comprised an electrode as shown in FIG. 5(a) and an element having a shape shown in FIG. 6(b), was prepared.

An n—GaN layer (thickness 3 μm, dopant Si, carrier concentration $1\times10^{18}$ cm$^{-3}$) was grown on a sapphire substrate (C face) 50 via a GaN buffer layer (not shown) to give a contact layer 40, and an n$^-$—GaN layer (thickness 3 μm, dopant Si, carrier concentration $1\times10^{15}$ cm$^{-3}$) was grown thereon to give a light receiving layer 10, and then an n—GaN layer (thickness 50 nm, dopant Si, carrier concentration $1\times10^{18}$ cm$^{-3}$) was grown to give an ohmic contact layer (not shown).

A transparent ohmic electrode 20, Al (thickness 50 nm)/Ti (thickness 50 nm), was formed on a light receiving surface 10a via an ohmic contact layer, and the outer periphery was etched by RIE to the depth of 2.2 μm, leaving the central part intact to expose the contact layer 40. As an ohmic electrode 30, Al (thickness 500 nm)/Ti (thickness 10 nm) was formed on the exposed surface to give a photoconductive type light receiving element.

Figure 7:
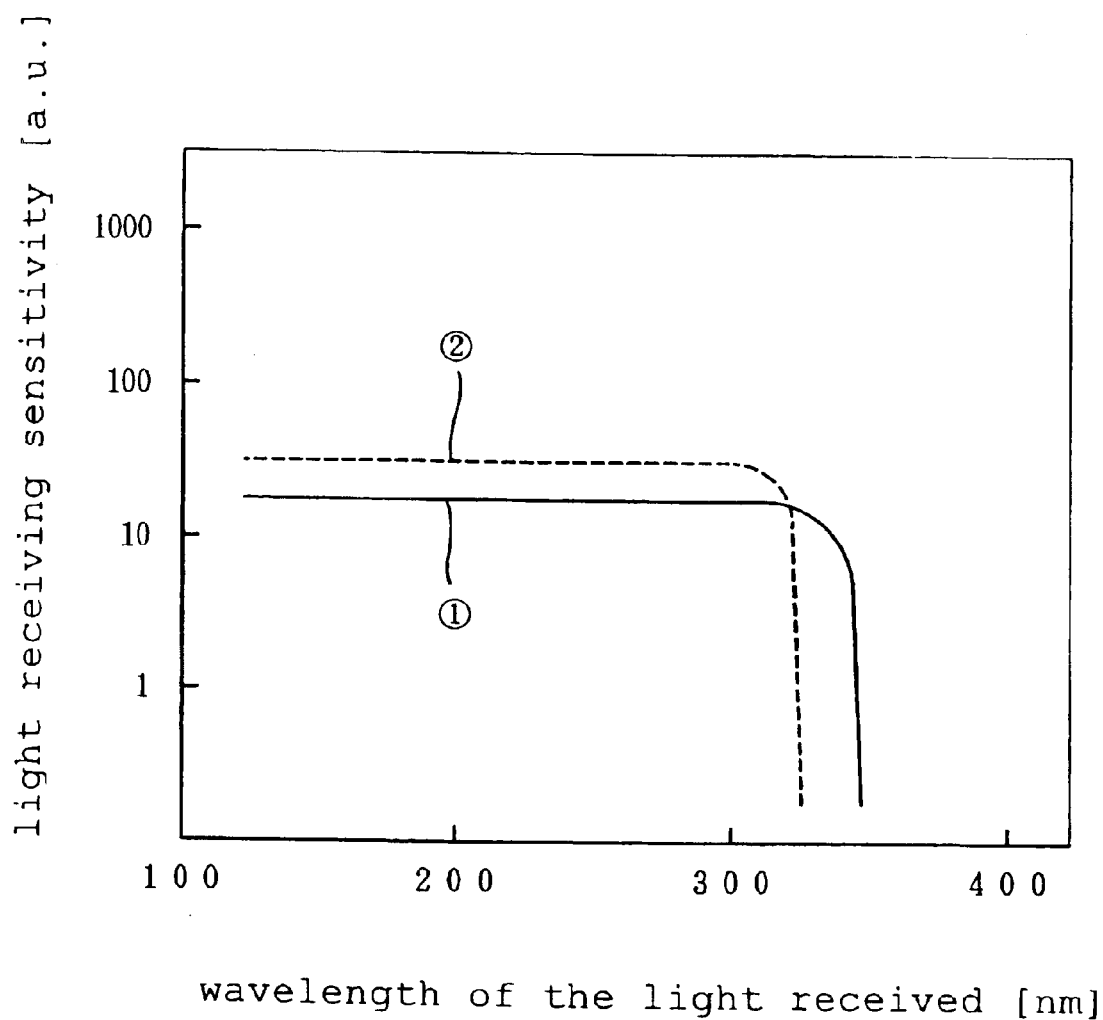
FIG. 7 is a graph showing the properties of the light receiving sensitivity of the light receiving elements prepared in Examples 3, 4, and shows the relationship of the wavelength of the irradiated light and the light receiving sensitivity. In this Figure, the curve ① drawn with a solid line shows Example 3, the curve ② drawn with a dotted line shows Example 4, and the axis of ordinates showing the light receiving sensitivity is an arbitrary scale.
Figure 8:
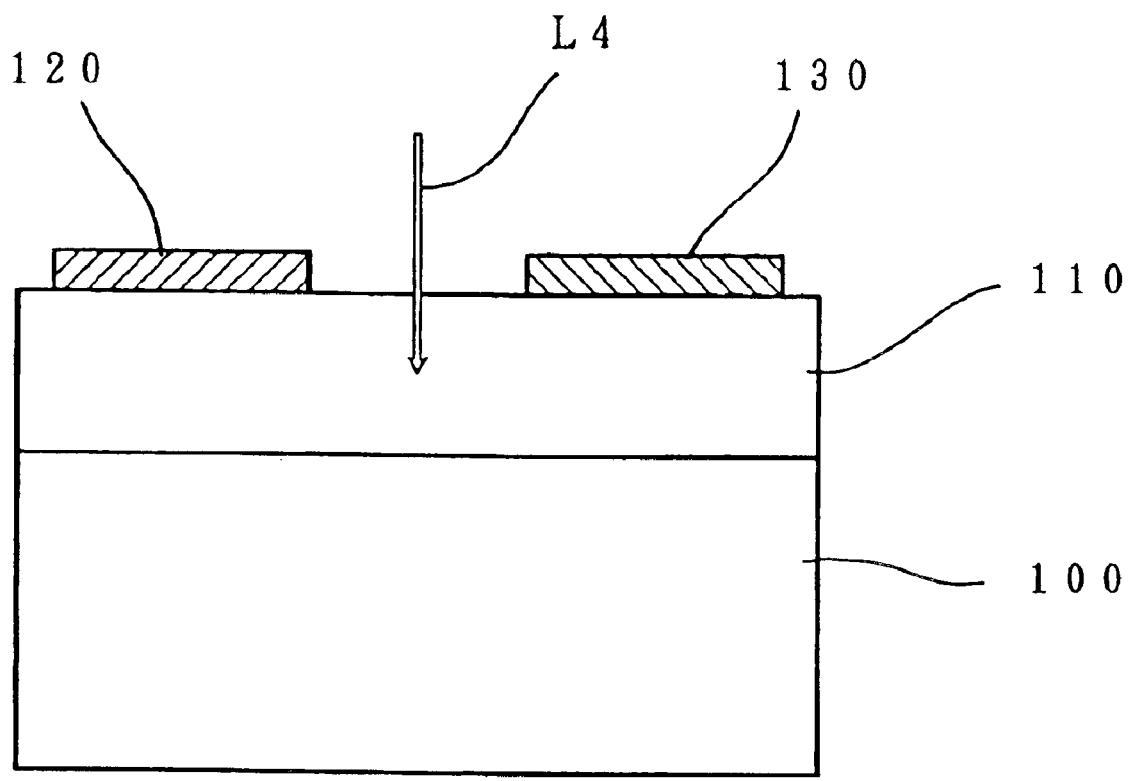
FIG. 8 is a schematic view showing the structure of a conventional photoconductive type light receiving element.

As the light to be received L, a light at various wavelengths shorter than 450 nm was irradiated, and the light receiving sensitivity was examined. As a result, as shown with the curve ① drawn with a solid line in the graph of FIG. 7, the curve rose from the proximity to 365 nm and was found to show flat properties to the light having a wavelength shorter than that.

Example 4

In the same manner as in Example 3 except that the material of the light receiving layer was Al$_{0.1}$Ga$_{0.9}$N, and an ohmic electrode to be formed on a light receiving layer was an opaque electrode 20 shown in FIG. 5(b) in this Example, a photoconductive type light receiving element of the above-mentioned (8) was prepared.

The ohmic electrode 20 on the light receiving layer 10 was Al (thickness 0.5 μm)/Ti (thickness 0.1 μm). The electrode 20 drawn on the light receiving surface 10a had a pattern comprising one strip conductor as a trunk line and a number of strip conductors branching therefrom, thereby forming a "comblike" electrode.

In the same manner as in Example 3, the light receiving sensitivity was examined. As a result, as shown with the curve ② drawn with a broken line in the graph of FIG. 7, the curve rose from the proximity to 340 nm and was found to show flat properties to the light having a wavelength shorter than that.

Industrial Applicability

As explained in the foregoing, the light receiving element of the present invention comprises a GaN group semiconductor, which results in superior resistance to ultraviolet light.

A Schottky barrier type light receiving element of the above-mentioned (2), which is a Schottky barrier type element having an opaque electrode, has a structure wherein the light from the upper surface side of the Schottky electrode is received. This has a consequence that the light to be received does not pass a GaN group semiconductor layer, but can enter the depletion layer directly even from the electrode side. By this constitution, the element has superior sensitivity even to the light having a blue to ultraviolet range wavelength. In particular, a shorter wavelength does not cause decreased sensitivity.

In the photoconductive type light receiving element of the above-mentioned (8), the generated carrier moves in the thickness direction of the light receiving layer. As a result, crystal conditions, such as contamination, degradation and the like of the proximity of the light receiving surface, do not have a great influence on the sensitivity.

This application is based on patent application Nos. 265506/1998 and 265516/1998 filed in Japan, the contents of which are hereby incorporated by reference.

What is claimed is:

1. A semiconductor light receiving element comprising (a) a light receiving layer comprising a GaN group semiconductor, wherein the light receiving layer is a first conductivity type layer, (b) an electrode formed on one surface of the light receiving layer as a light receiving surface in such a manner that light can enter the light receiving layer, and (c) a depletion layer formed under the electrode, which depletion layer extends to cover an area around the electrode, wherein (i) the light receiving element is a Schottky barrier type light receiving element in which light enters the depletion layer from the side the electrode is formed, (ii) the electrode formed on the light receiving surface comprises at least a Schottky electrode, and (iii) a total of boundary lines between areas of the light receiving surface covered with the Schottky electrode and exposed areas is longer than the length of the outer periphery of the light receiving surface.

2. The light receiving element of claim 1, wherein the Schottky electrode has a wiring pattern formed by strip conductors in combination.

3. The light receiving element of claim 1, wherein the strip conductors have a width of 0.1 $\mu$m–2000 $\mu$m.

4. The light receiving element of claim 1, wherein the wiring pattern is a comblike pattern.

5. The light receiving element of claim 1, wherein the light receiving layer is an uppermost layer of a laminate comprising one or more layers comprising a first conductivity type GaN group semiconductor formed on a crystal substrate, wherein the light receiving element comprises an ohmic electrode formed on a layer other than the light receiving layer.

6. The light receiving element of claim 5, wherein the crystal substrate is made from a conductive material and the ohmic electrode is formed on the crystal substrate.

* * * * *